(12) United States Patent
Nakano et al.

(10) Patent No.: US 7,352,114 B2
(45) Date of Patent: Apr. 1, 2008

(54) SURFACE ACOUSTIC WAVE ELEMENT, SURFACE ACOUSTIC WAVE DEVICE, SURFACE ACOUSTIC WAVE DUPLEXER, AND METHOD OF MANUFACTURING SURFACE ACOUSTIC WAVE ELEMENT

(75) Inventors: Masahiro Nakano, Tokyo (JP); Masaki Sobu, Tokyo (JP); Shigeki Ohtsuka, Tokyo (JP); Yasunaga Kagaya, Tokyo (JP)

(73) Assignee: TDK Corporation, Tokyo (JP)

( * ) Notice: Subject to any disclaimer, the term of this patent is extended or adjusted under 35 U.S.C. 154(b) by 210 days.

(21) Appl. No.: 10/889,043

(22) Filed: Jul. 13, 2004

(65) Prior Publication Data
US 2005/0012435 A1   Jan. 20, 2005

(30) Foreign Application Priority Data
Jul. 17, 2003  (JP)  ............................. 2003-276300

(51) Int. Cl.
*H01L 41/047* (2006.01)
*H01L 41/04* (2006.01)
*H03H 9/125* (2006.01)

(52) U.S. Cl. ................ 310/365; 310/363; 310/364; 310/366

(58) Field of Classification Search ..... 310/313 A–313 D, 363–366, 358; *H03H 9/145, 9/25, 3/08; H01L 41/08, H01L 21/66*
See application file for complete search history.

(56) References Cited

U.S. PATENT DOCUMENTS

| | | | |
|---|---|---|---|
| 5,061,870 A | 10/1991 | Ieki et al. | |
| 5,144,185 A | 9/1992 | Yuhara et al. | |
| 5,162,690 A | 11/1992 | Ieki et al. | |
| 6,316,860 B1 * | 11/2001 | Kimura et al. | .......... 310/313 A |
| 6,407,486 B1 | 6/2002 | Kimura et al. | |
| 6,815,834 B2 * | 11/2004 | Shimoe et al. | .............. 257/779 |
| 2002/0047495 A1 | 4/2002 | Nakano et al. | |
| 2002/0121841 A1 | 9/2002 | Shimoe et al. | |
| 2002/0195675 A1 | 12/2002 | Hakamada | |
| 2003/0020376 A1 * | 1/2003 | Sakaguchi et al. | .......... 310/364 |

(Continued)

FOREIGN PATENT DOCUMENTS

EP   0 407 163 A2   1/1991

(Continued)

OTHER PUBLICATIONS

Kimura(IEEE 1998, Ultrasonic Symposium, High Power-Durable and Low Loss Single-Crystalline Al/Ti Electrode for RF Saw Devices, p. 315-318 ).*

(Continued)

*Primary Examiner*—J. San Martin
(74) *Attorney, Agent, or Firm*—Oliff & Berridge, PLC

(57) ABSTRACT

A surface acoustic wave element includes a thin film electrode composed of monocrystal aluminum disposed on a piezoelectric substrate. At least one metal of Cu, Ta, W, and Ti is segregated in the thin film electrode composed of monocrystal aluminum. In this surface acoustic wave element, segregation of Cu or the like occurs in the thin film electrode. Such segregation is effective to reduce the occurrence of cracks on the piezoelectric substrate during ultrasonic wave connection for flip chip mounting. That is, because the occurrence of cracks on the piezoelectric substrate is reduced, tolerance against the ultrasonic vibration is advantageously improved in the surface acoustic wave element.

11 Claims, 11 Drawing Sheets

U.S. PATENT DOCUMENTS

2003/0067369 A1   4/2003   Nakano et al.
2003/0174028 A1   9/2003   Takayama et al.

FOREIGN PATENT DOCUMENTS

| | | |
|---|---|---|
| EP | 0 940 914 A1 | 9/1999 |
| EP | 940914 * | 9/1999 |
| EP | 1 158 668 A1 | 11/2001 |
| EP | 1 296 451 A2 | 3/2003 |
| EP | 1296451 * | 3/2003 |
| JP | A-55-49014 | 4/1980 |
| JP | A-62-163408 | 7/1987 |
| JP | A-64-80113 | 3/1989 |
| JP | A-1-128607 | 5/1989 |
| JP | A-6-132777 | 5/1994 |
| JP | A-7-107967 | 4/1995 |
| JP | B2-2545983 | 8/1996 |
| JP | B2-2555072 | 8/1996 |
| JP | A-2003-78384 | 3/2003 |
| JP | A-2003-86625 | 3/2003 |
| JP | A-2003-101372 | 4/2003 |
| JP | A-2003-110403 | 4/2003 |
| WO | WO 00/74235 A1 | 12/2000 |
| WO | WO 02/35702 A1 | 5/2002 |
| WO | WO0235702 * | 5/2002 |
| WO | WO 0235702 A1 * | 5/2002 |

OTHER PUBLICATIONS

Kimura, Noritoshi. The Power Durability of 900 MHz Band Double-Mode-Type Surface Acoustic Wave Filters and Improvement in Power Durability of Al-Cu Thin Film Electrodes by Cu Atom Segregation, Jpn. J. Appl. Phys. vol. 36 (1997) pp. 3101-3106).*

1998 IEEE Ultrasonics Symposium, "High Power-Durable and Low Loss Single-Crystalline Al/Ti Electrodes for RF SAW Devices", Noritoshi Kimura et al., pp. 315-318.

Thin Solid Films, 64 (1979), "Improved Metallization for Surface Acoustic Wave Devices", J. I. Latham et al., pp. 9-15.

* cited by examiner

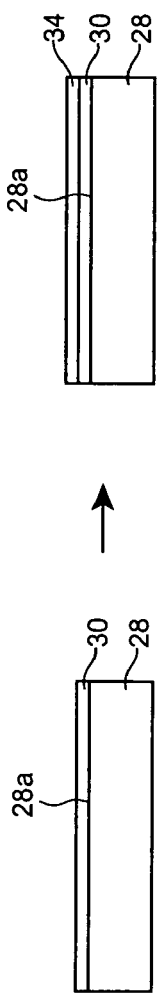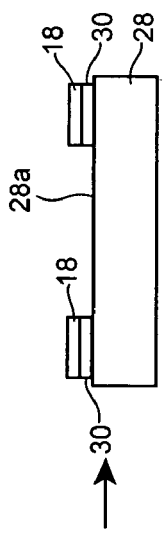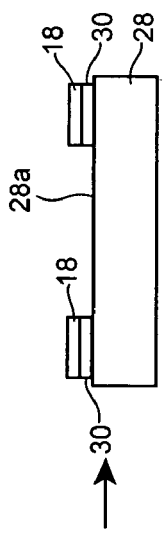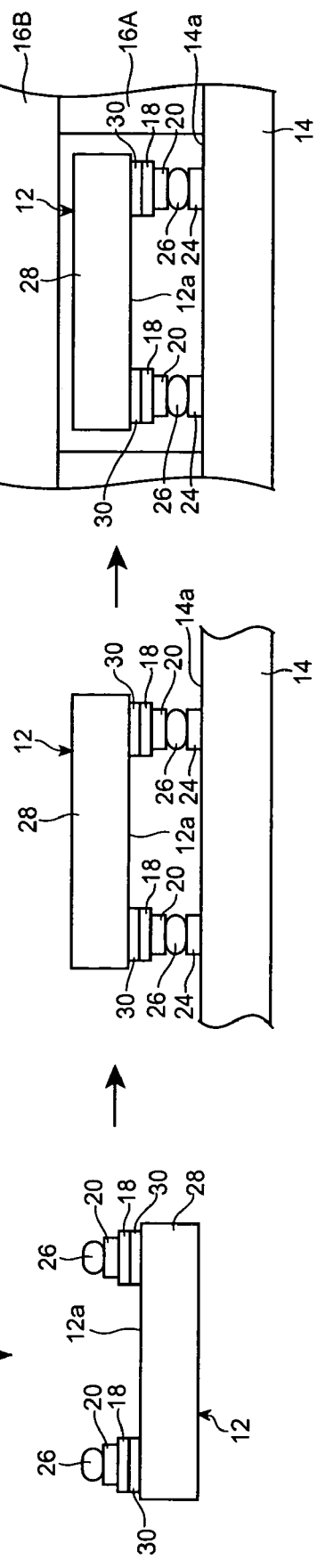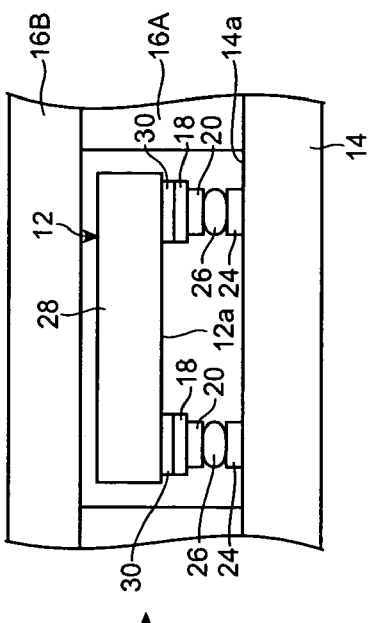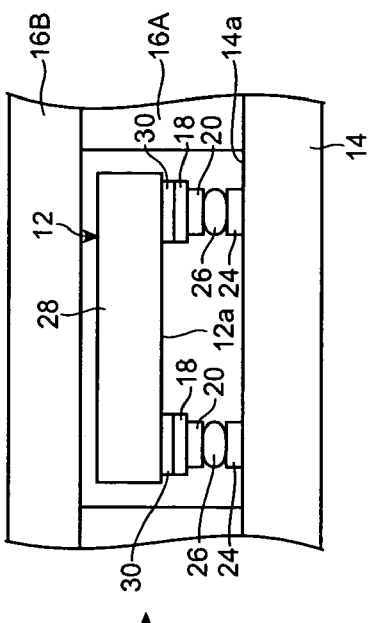

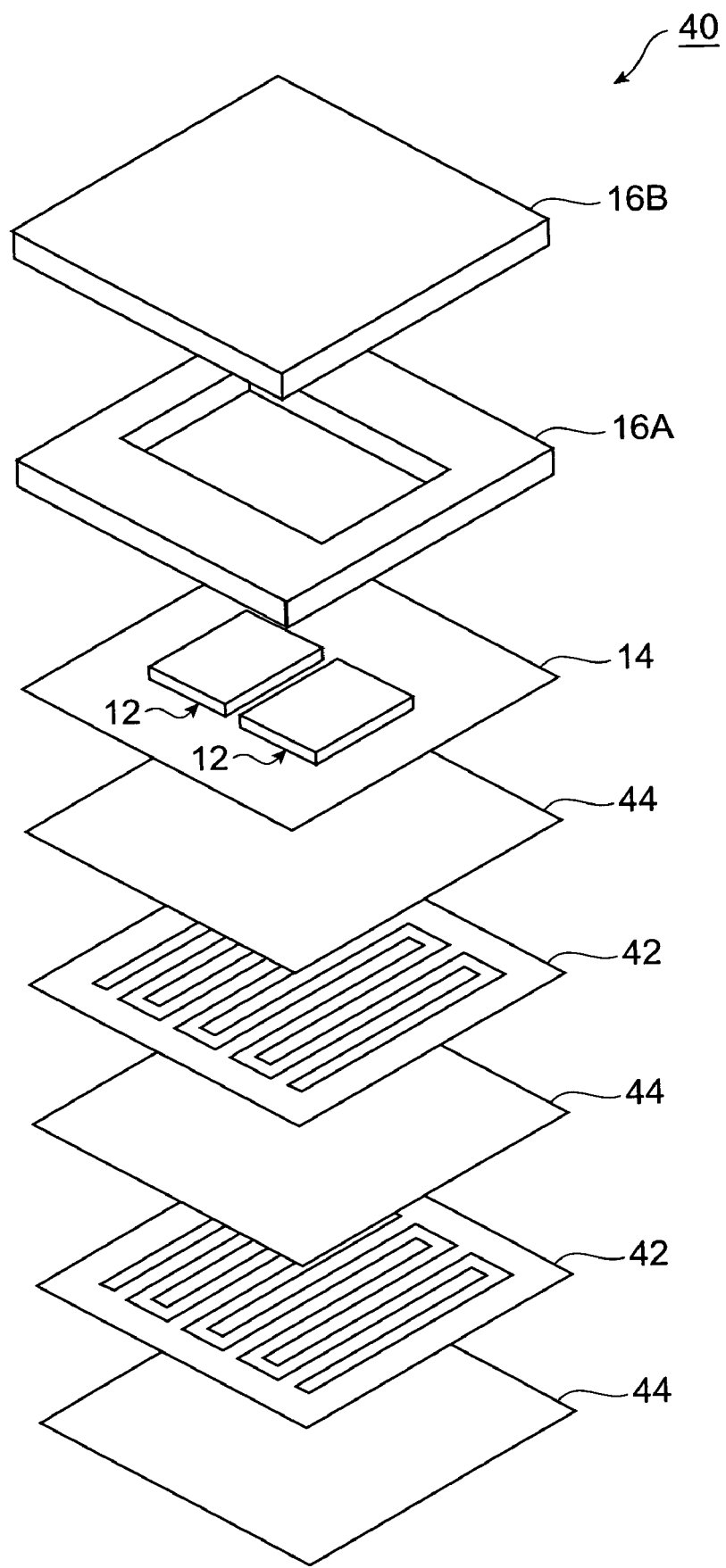

SURFACE ACOUSTIC WAVE ELEMENT, SURFACE ACOUSTIC WAVE DEVICE, SURFACE ACOUSTIC WAVE DUPLEXER, AND METHOD OF MANUFACTURING SURFACE ACOUSTIC WAVE ELEMENT

BACKGROUND OF THE INVENTION

1. Field of Invention

This invention relates to a surface acoustic wave element, a surface acoustic wave device, a surface acoustic wave duplexer and a method of manufacturing the surface acoustic wave element.

2. Description of Related Art

Recently, instead of a filter and a resonator using dielectrics, a surface acoustic wave filter and a surface acoustic wave resonator, which are kinds of surface acoustic wave devices, are often used in a high frequency circuit for mobile communication devices, such as cellular phones and cordless phones. This is because the surface acoustic wave filter is smaller than a dielectric filter and has higher electric characteristics in the same size.

Such surface acoustic devices mainly have a piezoelectric substrate, an inter digital transducer (hereafter referred to as "IDT") obtained by forming electrode films laminated on the piezoelectric substrate, and a package that accommodates the piezoelectric substrate and the IDT. Lithium niobate ($LiNbO_3$), lithium tantalate ($LiTaO_3$) and crystal are used as the material for the piezoelectric substrate. When producing a piezoelectric substrate for an RF band filter, lithium niobate and lithium tantalite, which have a high electric-mechanical coupling coefficient are often used. Because the lithium niobate has a large electric-mechanical coupling coefficient, one having a 64°-rotated Y-cut is used. In addition, because lithium tantalate has a high electric-mechanical coupling coefficient and a relatively small frequency-temperature coefficient, one having a 34-44°-rotated Y-cut is used. Furthermore, in many cases, aluminum having a characteristic such as low specific weight and low resistance, is used.

As described above, surface acoustic wave devices are often used for the RF band (800 MHz-2 GHz), such as a cellular phone. For example, when used in the 1 GHz band, it is necessary to reduce electrode finger width (line width) and electrode spacing of the IDTs to about 1 µm. However, repeated stresses that are proportional to the frequencies are applied to the IDT on the piezoelectric substrate, and migration of aluminum atoms originated by the repeated stress are generated, causing defects, such as hillocks (protrusions) or voids (depletions) on the IDT, which are problematic in that the life of the device is shortened. That is, electric power proofness of the IDT (i.e., the electrode film) becomes an important factor for the life of the device. In addition, deterioration of the IDT noticeably appears not only at high frequencies, but also with the increase in the applied voltage. Moreover, as the frequencies become higher due to the design, the electrode film must be made thinner, and the electrode width must be narrowed. As a result, such deterioration increases.

For miniaturization of cellular telephones, it is effective to miniaturize a splitter (duplexer), which uses a large space in the high frequency part of the cellular phone. Therefore, it has been proposed to change a dielectric duplexer that has been used as the splitter to a surface acoustic wave duplexer. However, although the surface acoustic wave duplexer is a very small component, there is a problem in its electric power proofness against large power applied especially to the transmitter side of the duplexer. The electric power proofness can be improved by reducing the effective power density, which can be done by designing the IDT formation area of the surface acoustic wave device to be large. However, there could be a problem with this technique in that the device cannot be made smaller than a certain size.

For the above reasons, there has been a strong demand to improve the electric power proofness of the IDT of surface acoustic wave devices, that is, the electric power proofness of the electrode film formed on the piezoelectric substrate.

As a means for improving the deterioration of the electrode film due to migration of aluminum atoms, a technique to make the electrode film by an Al—Cu alloy by adding various metals, such as Cu, into aluminum is disclosed at pages 9-15 of J. I. Latham, Thin Solid Film, 64 (1979). By making the electrode film of an Al alloy, because generation of hillock or void on the electrode film is reduced, the electric power proofness of the IDT increases. Techniques to make the electrode film of an Al alloy are disclosed by Japanese Patent Publication No. H7-107967, Japanese Patent No. 2555072, Japanese Laid-Open Patent Application No. S64-80113, Japanese Laid-Open Patent Application No. H1-128607, and the like. In each of the techniques, the deterioration of the IDT is reduced by adding a small amount of various metals into aluminum, that is, the material for the electrode film to control the migration of aluminum atoms.

In addition, diffusion of aluminum is faster at the grain boundary than inside the grain. That is, it is considered that controlling the diffusion at the grain boundary has priority. Therefore, it is thought that the migration of aluminum atoms that originates in the repeated stress in the surface acoustic wave device is caused mainly at the grain boundary. This has conventionally been addressed.

It has been predicted that the electric power proofness can be considerably improved by reducing or eliminating the grain boundary of the aluminum electrode film and more preferably by making the aluminum electrode film a monocrystal. Techniques that make the electrode film substantially a monocrystal are disclosed in Japanese Laid-Open Patent Application No. S55-49014. In the techniques disclosed in Japanese Laid-Open Patent Application No. S55-49014, the performance of the device is improved regardless of the material that composes the surface acoustic wave device. In addition, the techniques to use a monocrystal aluminum film or an aluminum film in which crystal orientation is oriented in a constant direction in the electrode film of the surface acoustic wave device, are disclosed in Japanese Patent No. 2545983. Here, a Y-cut crystal substrate in the range from 25°-rotated Y-cut to 39°-rotated Y-cut is used as the piezoelectric substrate, and by vapor-deposition at high speed (film formation speed: 4 nm/sec) and low temperature (substrate temperature: 80° C.), a (311) oriented film is obtained. This film is said to be an epitaxial film close to a monocrystal. In addition, Japanese Patent No. 2545983 discloses that the use of additives, such-as Cu, Ti, Ni, Mg and Pd, that are considered to be a counter-measure for migration in aluminum has a life-prolonging effect. However, it is not disclosed how such additives are included in aluminum whose orientation is arranged in a constant direction of the crystal orientation.

Japanese Laid-Open Patent Application No. H6-132777 discloses a technique related to an aluminum monocrystal electrode film different from that disclosed in Japanese Laid-Open Application No. S55-49014. In this reference, it is disclosed that an aluminum monocrystal film is obtained by forming the film at extremely low speed. More specifically, it is possible to form an aluminum monocrystal film by a vacuum vapor depositing method on a 128°-rotated Y-cut lithium niobate substrate and to form an aluminum monocrystal film by a vacuum vapor depositing method on a 12°-rotated X-cut lithium tantalate substrate. However, with the above method, because it is necessary to set the film forming speed extremely slow, there is a problem in terms of mass-producability. In this conventional technique, although it is indicated that approximately 0.1-2 wt % of Cu can be added as an additive, it is not discussed that the characteristics of the aluminum monocrystal film are changed by this additive.

International Publication No. WO 00/74235 and Japanese Laid-Open Patent Application No. 2003-101372 disclose that a 38-44°-rotated Y-cut lithium tantalate monocrystal substrate is used as the piezoelectric substrate, an alternate finger-type electrode includes a titanium base metal film and an aluminum film formed thereon, and the aluminum film becomes a monocrystal film due to an effect of the titanium base metal film.

Recently, with respect to the mounting of the surface acoustic wave device, flip chip mounting has been used in which the space for mounting the surface acoustic device is smaller, and the characteristics are more stable than the conventional wire bonding mounting. There are mainly two methods for flip chip mounting. The first is a method that uses solder bumps and mounts the surface acoustic wave device by melting the solder bumps, and the second is a method that uses gold bumps and mounts the surface acoustic wave device by ultrasonic connection. Details of the ultrasonic technique are described below. Bumps of solder, gold or the like are formed on an Al pad electrode of the surface acoustic wave element. With the surface on which the bumps are formed and a printed wiring board facing each other, the bumps of the element and an Au electrode terminal of the printed wiring board are contacted. With such a contact, the bumps and the electrode terminal are connected by vibrating the surface acoustic wave element with ultrasonic waves, and a surface acoustic wave device with strong connections and reliable conduction is manufactured.

SUMMARY OF THE INVENTION

However, the above described conventional surface acoustic wave devices have the following problems. That is, it has been revealed by experiments conducted by the inventors that cracks may occur in areas of the piezoelectric substrate on which gold bumps are formed or the surrounding areas thereof, when surface acoustic wave elements are mounted on the printed wiring board by flip chip mounting with ultrasonic connection using gold bumps. When there are cracks on the piezoelectric substrate, problems occur, such as breaking of wires and deterioration of characteristics of the surface acoustic wave device.

Moreover, due to the desirability of making the device small and thin, the use of flip chip mounting is desired also for the surface acoustic wave duplexer that requires high electric power proofness. However, in the surface acoustic wave duplexer, power that is substantially larger than in a SAW filter is applied to the device. Therefore, the improvement of electric power proofness is insufficient with the techniques disclosed by the above described Japanese Patent Publication No. H7-107964, Japanese Patent No. 2555072, Japanese Laid-Open Application No. S64-80113 and Japanese Laid-Open Patent Application No. H1-128607. To satisfy the electric power proofness, it has been considered to use aluminum monocrystal electrodes. However, in this case, in flip chip mounting using ultrasonic waves, cracks occur in the areas of the piezoelectric substrate on which gold bumps are formed and the surrounding areas thereof even if the intensity of ultrasonic waves is decreased. However, when the intensity is decreased, highly intense ultrasonic waves are not applied for the ultrasonic connection. As a result, there are problems in that the bonding strength of the elements onto the substrate is not sufficient to satisfy reliability tests, such as an impact test.

After repeating studies of the phenomenon that cracks occur on the piezoelectric substrate, the inventors discovered that the applied force generated by lattice mismatch with the base metal can be reduced during the process of epitaxial growth of the aluminum monocrystal electrodes.

it is one aspect of this invention to address the above described problems while providing a surface acoustic wave element, a surface acoustic wave device, and a surface acoustic wave duplexer that can tolerate ultrasonic vibrations, and a method for manufacturing such a surface acoustic wave element.

A surface acoustic wave element is disclosed in which at least one metal of Cu, Ta, W, and Ti is segregated in thin film electrodes composed by monocrystal aluminum that is provided on a piezoelectric substrate.

In this surface acoustic wave element, segregation of Cu or the like occurs to the thin film electrode. It was discovered by experiments conducted by the inventors that such segregation is effective for controlling the conditions under which cracks occur on the piezoelectric substrate during the ultrasonic connection for flip chip mounting. That is, because the conditions under which cracks occur on the piezoelectric substrate are controlled as described above, the tolerance against the ultrasonic vibration is advantageously improved for the surface acoustic wave element. In this specification, the segregation of metal not only means that the atoms precipitate locally, but also includes the meaning that an alloy, in which a metal is included at high concentration, is precipitated locally.

It is preferred that a buffer layer is provided between the piezoelectric substrate and the thin film electrode, and that the buffer layer is composed of a material having a lattice constant that is between a lattice constant of a material of the piezoelectric substrate and a lattice constant of a material of the thin film electrodes. In this case, because lattice mismatch between the piezoelectric substrate material and the thin film electrode material is buffered by the buffer layer, the aluminum can be easily monocrystalized during the formation of the thin film electrode.

Furthermore, it is preferable that the material of the piezoelectric substrate is lithium tantalate or lithium niobate, and that the material that forms the buffer layer is TiN or Ti. In addition, it is preferable that a grain diameter of the segregated metal is at least 100 nm and no greater than 1000 nm.

A surface acoustic wave device may be comprised of a surface acoustic wave element in which at least one type of metal of Cu, Ta, W, Ti is segregated in a thin film electrode composed by monocrystal aluminum formed on a piezoelectric substrate, a mounting substrate having electrode terminals formed on a surface on which the surface acoustic wave element is mounted, and a bump electrode disposed between the thin film electrode of the surface acoustic wave element and the electrode terminals of the mounting substrate.

In this surface acoustic wave device, segregation of Cu or the like occurs on the thin film electrode of the surface acoustic wave element. It was newly discovered by experiments conducted by the inventors that such segregation is effective for reducing the conditions under which cracks occur on the piezoelectric substrate during the ultrasonic connection process performed when mounting the surface acoustic wave element on the mounting substrate by flip chip mounting. That is, because the conditions under which the cracks occur on the piezoelectric substrate as described above are reduced, tolerance against the ultrasonic vibration is advantageously improved in the surface acoustic wave device.

A surface acoustic wave duplexer may be comprised of a surface acoustic wave element in which at least one type of metal of Cu, Ta, W, and Ti is segregated into a thin film electrode composed by monocrystal aluminum formed on a piezoelectric substrate.

In this surface acoustic wave duplexer, segregation of Cu or the like occurs on the thin film electrode of the surface acoustic wave element. It was newly discovered by experiments conducted by the inventors that such segregation is effective for reducing the conditions under which cracks occurs on the piezoelectric substrate during the ultrasonic connection process performed when mounting the surface acoustic wave duplexer by flip chip mounting. Because the conditions under which the cracks occur on the piezoelectric substrate as described above are reduced, tolerance against the ultrasonic vibration is advantageously improved in the surface acoustic wave duplexer.

A method for manufacturing a surface acoustic wave element may comprise the steps of: (1) forming an electrode film composed by monocrystal aluminum, in which at least one metal of Cu, Ta, W and Ti is segregated, on a piezoelectric substrate by sputtering Al alloy, and (2) forming a thin film electrode by patterning the electrode film.

BRIEF DESCRIPTION OF THE DRAWINGS

FIGS. 4A-4F are diagrams showing steps performed while manufacturing the surface acoustic wave element shown in FIG. 1;

FIG. 7 is a perspective exploded view showing a surface acoustic wave duplexer according to an exemplary embodiment of this invention;

DETAILED DESCRIPTION OF PREFERRED EMBODIMENTS

A preferred exemplary embodiment of a surface acoustic wave element, a surface acoustic wave device, a surface acoustic wave duplexer and a method of manufacturing the surface acoustic wave element is described in detail below with reference to the attached drawings. The same symbols are used for the same or similar elements, and when reference to such elements is repeated, further description is omitted.

Figure 1:
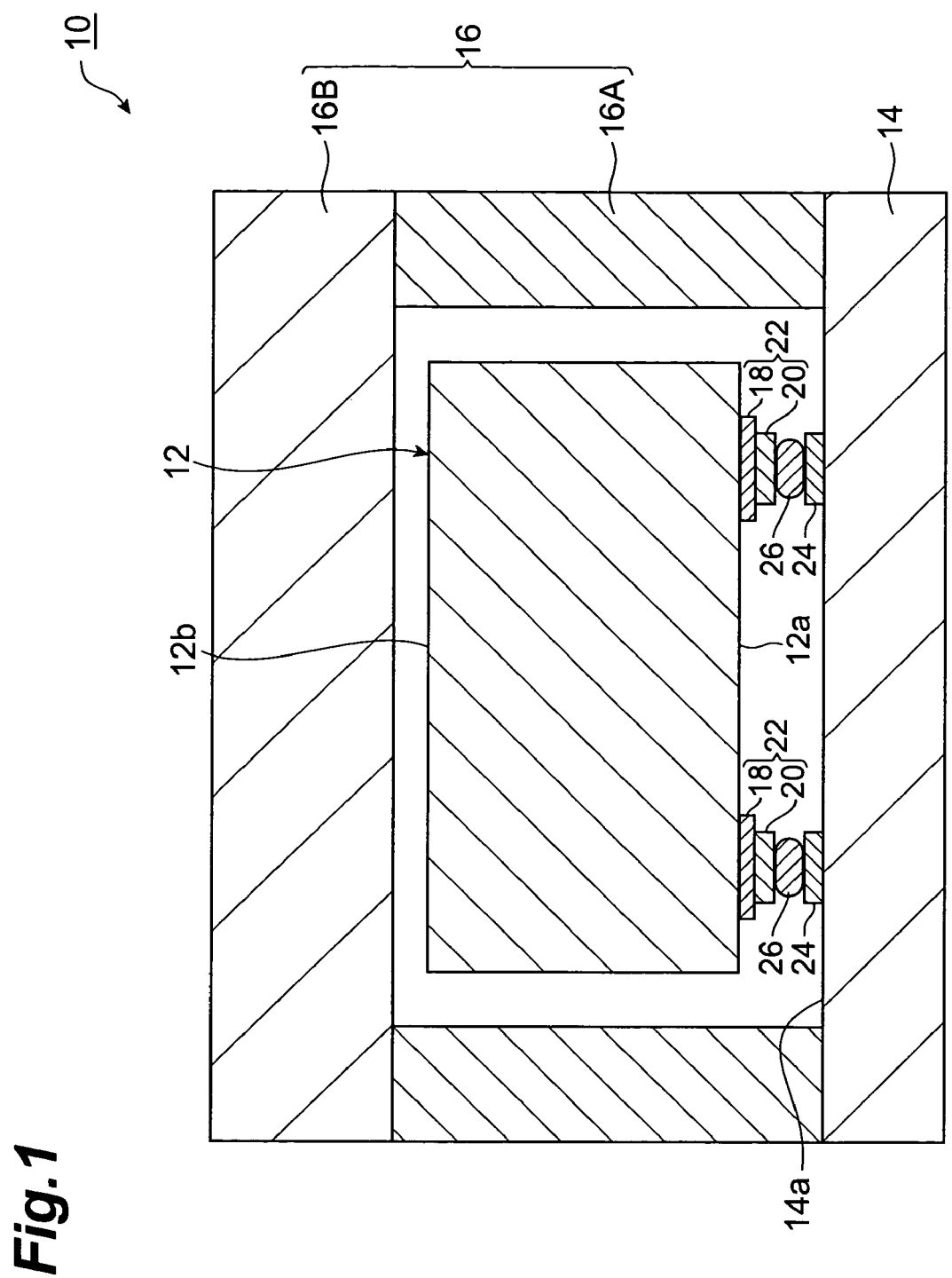
FIG. 1 is a schematic cross-sectional view of a surface acoustic wave device according to an exemplary embodiment of this invention.

FIG. 1 is a schematic cross-sectional view of a surface acoustic wave device according to an exemplary embodiment of this invention. As shown in FIG. 1, a surface acoustic wave device 10 includes a surface acoustic wave element 12, a mounting substrate 14 on which the surface acoustic wave element 10 is mounted, and a cover 16 that covers the surface acoustic wave element 12. On a lower surface 12a of the surface acoustic wave element 12, later described pad electrodes 22 are formed in which raised electrodes 20 are laminated over three pairs of input/output electrodes (thin film electrodes) 18. On a surface 14a of the mounting substrate 14 on which the surface acoustic wave element 12 is mounted, gold-plated electrodes (electrode terminals) 24 for applying voltage necessary for operating the surface acoustic wave element 12 are formed. In addition, as shown in the figure, the corresponding pad electrodes 22 of the surface acoustic wave element 12 and the gold-plated electrodes 24 of the mounting substrate 14 are connected via Au bumps 26. The cover 16 is a member for sealing and protecting the surface acoustic wave element 12, and is structured from a dam part 16a that surrounds the surface acoustic wave element 12 from four directions and a cap part 16b that covers a top surface 12b of the surface acoustic wave element 12.

Figure 2:
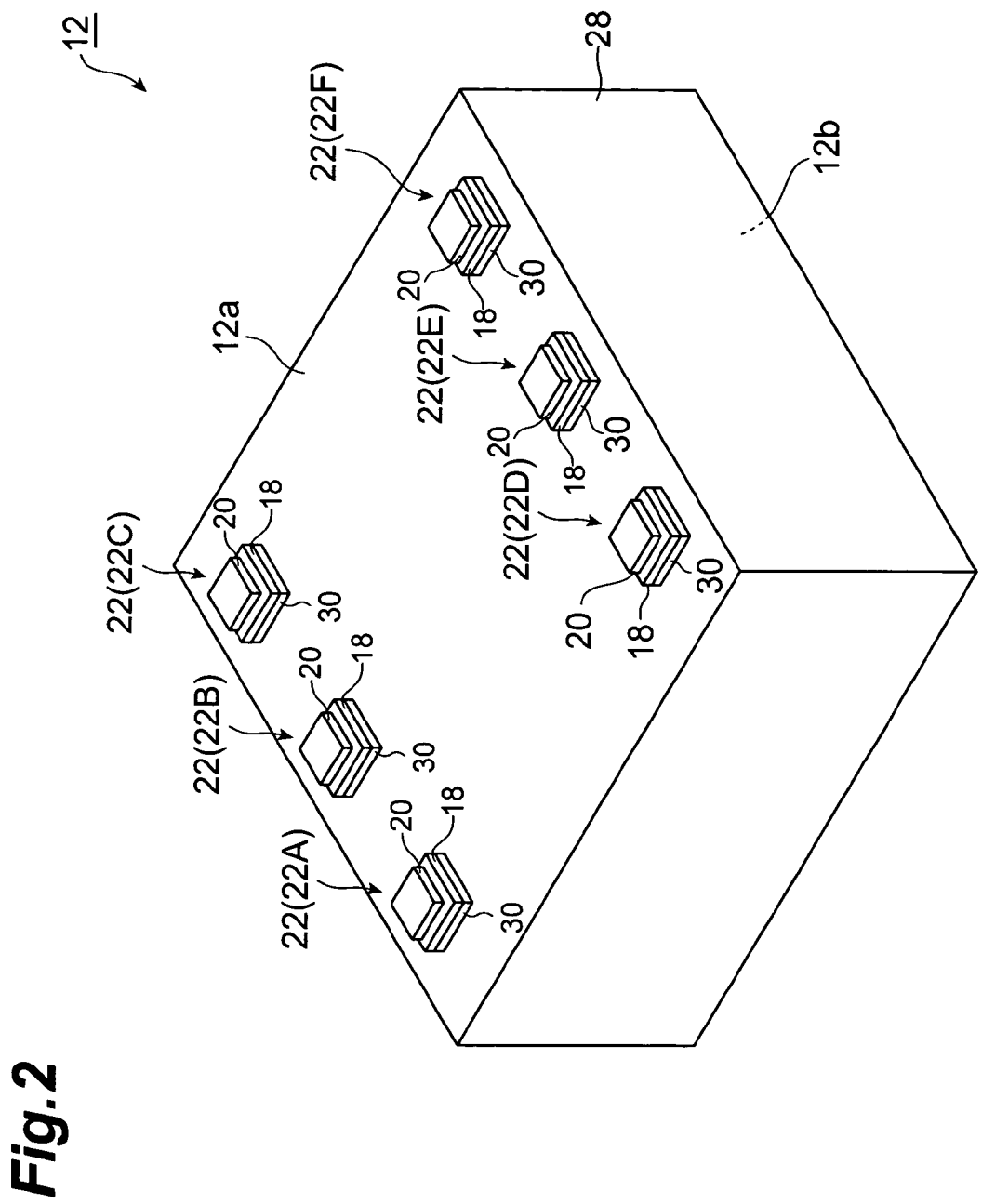
FIG. 2 is a schematic perspective view showing a surface acoustic wave element of the FIG. 1 device.

Next, referring to FIG. 2, the surface acoustic wave element 12 included in the surface acoustic wave device 10 is explained in detail. FIG. 2 is a schematic perspective view showing the surface acoustic wave element 12. As shown in FIG. 2, the surface acoustic wave element 12 has a piezoelectric substrate 28, a buffer layer 30 laminated on the piezoelectric substrate 28, and the pad electrodes 22 formed on the piezoelectric substrate 28 via the buffer layer 30.

The piezoelectric substrate 28 is a substrate made of lithium tantalate having extra piezoelectricivity (pyroelectricivity) and has a square column shape of which the cross-section is substantially square. The material for the piezoelectric substrate alternatively may be lithium niobate.

Each of the six pad electrodes 22 has input/output electrodes 18 on which a monocrystal aluminum electrode film (described later), in which Cu is segregated, is formed, and the raised electrode 20 for increasing the thickness of the input/output electrode 18. Three pad electrodes 22 are positioned along each of opposite sides of the piezoelectric substrate 28. The three pad electrodes 22 along each side are positioned at equal distance, such that the middle pad electrode (22B and 22E) is positioned at the center of the side. By positioning the pad electrodes 22 as described above, the center of gravity of the surface acoustic wave element 12 and the center of gravity of the piezoelectric substrate 28 are aligned in the direction of the normal line of the surface of the mounting substrate 14 when the surface acoustic wave element 12 is mounted on the mounting substrate 14 by flip chip mounting. Therefore, the surface acoustic wave element 12 has high stability. The monocrystal in this specification includes not only perfect monocrystal without any grain boundary but also includes monocrystal having a small amount of grain boundaries and sub-boundaries, and polycrystal having high orientation.

The buffer layer 30 is formed from TiN having a lattice constant between a lattice constant of the lithium tantalate, which is the material of the substrate 28, and a lattice constant of the aluminum, which is the material of the electrode 18.

Figure 3:
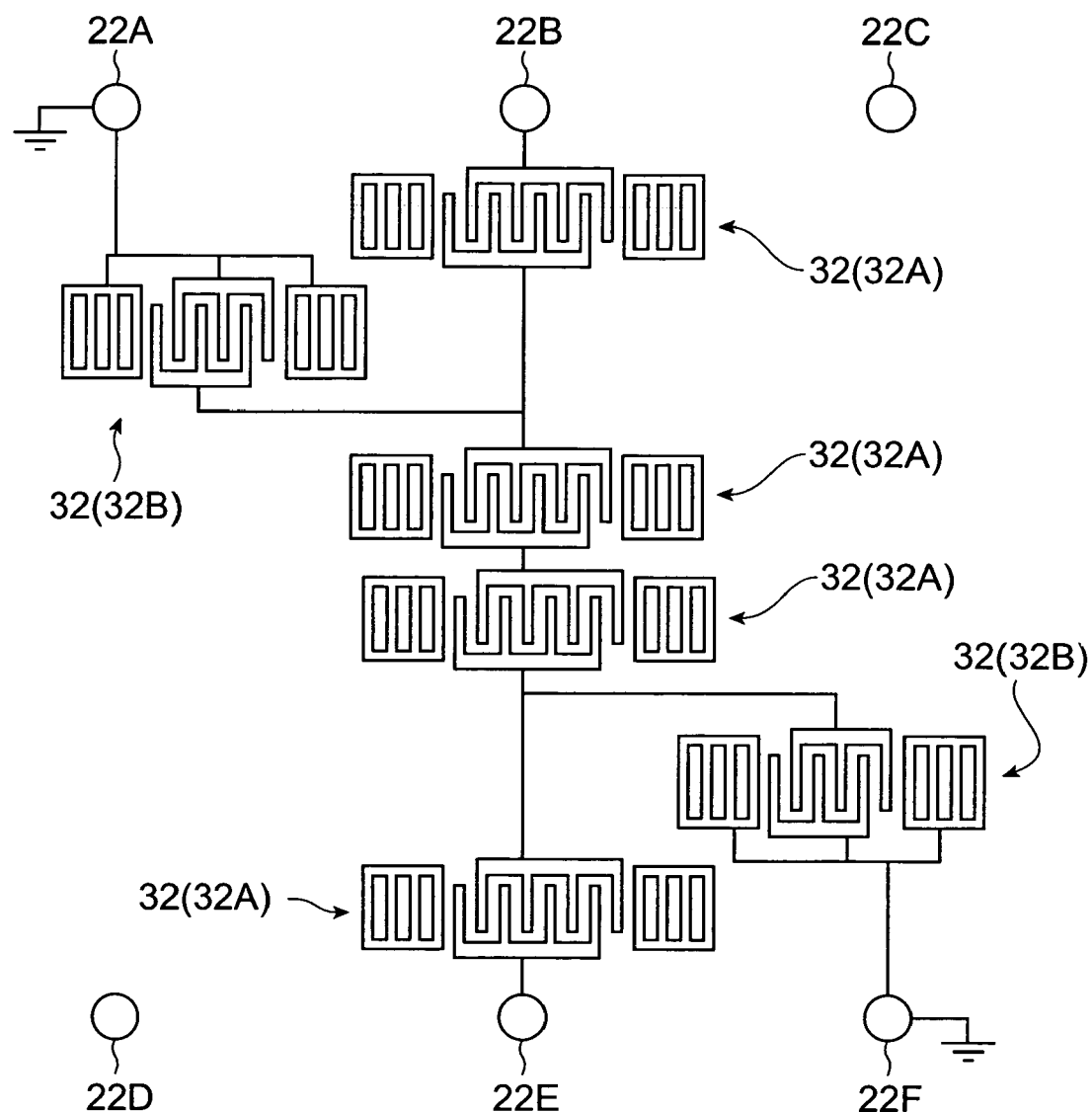
FIG. 3 is a schematic structural diagram showing electrode patterns formed on the surface acoustic wave element of FIG. 2.

Although omitted in FIG. 2, on the surface 12a of the surface acoustic wave element 12, column-shape electrodes and predetermined wiring patterns are formed in addition to the pad electrodes 22. FIG. 3 is a schematic structural diagram showing electrode patterns formed on the surface acoustic wave element 12. Symbols 22A-22F in FIG. 3 correspond to the pad electrodes 22A-22F shown in FIG. 2, respectively. Four pad electrodes 22A, 22B, 22E, and 22F are connected to six ladder-type column-shaped electrodes 32. In particular, four column-shaped electrodes 32 (serial arm resonators 32A) are serially connected between the pad electrode 22B and the pad electrode 22E that are positioned in the center. Additionally, wirings are brought out from wiring positions that are sandwiched by (i.e., located between) two serial arm resonators 32A in the middle among the four serial arm resonators 32A, and are connected respectively to the pad electrode 22A and the pad electrode 22F via the column-shaped electrodes 32 (parallel arm resonators 32B). The pad electrode 22A and the pad electrode 22F are connected to ground.

The electrode patterns are not limited to those shown in FIG. 3, and the number of the column-shaped electrodes 32 and the wiring patterns may be appropriately changed. However, by using the electrode patterns having a relationship of point symmetry, such as the electrode pattern shown in FIG. 3, the center of gravity of the surface acoustic wave element 12 and the center of gravity of the piezoelectric substrate 28 can be aligned in the direction of a normal line of the surface of the mounting substrate 14, when the surface acoustic wave element 12 is mounted on the mounting substrate 14 by flip chip mounting. Therefore, the stability of the surface acoustic wave element 12 can be improved.

Next, steps for manufacturing the surface acoustic wave device 10 shown in FIG. 1 are explained with reference to FIGS. 4A-4F, which show steps for manufacturing the surface acoustic wave device 10 shown in FIG. 1.

First, a piezoelectric substrate 28 having a three-inch diameter (for example) is prepared. After removing impurities by washing a laminated surface 28a of the piezoelectric substrate 28, the piezoelectric substrate 28 is placed in a sputtering device, such that the laminated surface 28a faces in the direction of a target material. Then, using a tantalum metal which has 99.9% purity as a target material, sputtering is performed in a mixed gas of nitrogen and argon to form a TiN buffer layer 30 on the laminated surface 28a of the piezoelectric substrate 28 (see FIG. 4A).

After forming the buffer layer 30 on the piezoelectric substrate 28, while maintaining a vacuum inside the sputtering device, the target material is changed to aluminum, to which Cu is added at a concentration of 0.5 wt %, and an aluminum electrode film 34 having a thickness of approximately 300 nm is formed over the buffer layer 30 on the piezoelectric substrate 28 (see FIG. 4B). The material composing the buffer layer 30 is not limited to TiN, but may be, for example, Ti or the like, or may be a material having a lattice constant between the lattice constant of the material of the electrode film 34 and the lattice constant of the material of the piezoelectric substrate 28. By selectively using such materials, lattice mismatch is eased, and the electrode film 34 can be easily monocrystalized. Thereafter, the piezoelectric substrate 28 is removed from the sputtering device, and using known photolithography (photo-etching) techniques, the above-described electrode patterns of a number corresponding to the number of elements to be made (e.g., 200 elements) are made on the buffer layer 30 and the electrode film 34 (see FIG. 4C).

After patterning, raised electrodes 20 having a thickness of approximately 500 nm are formed on the input/output electrodes 18 in the electrode pattern by a process similar to that used in the making of the input/output electrodes 18. This completes the manufacturing of the surface acoustic wave element 12. At this time, an insulation film composed from $Al_2O_3$ is formed on the surface of the raised electrodes 20 by exposure to air. In addition, on each raised electrode 20, a spherical bump of Au made by a bump bonder is pressed, and ultrasonic vibrations are applied, so that bumps 26 that penetrate through the insulation film formed on the surface of the raised electrodes 20 are formed (see FIG. 4D). Moreover, between the input/output electrodes 18 and the raised electrodes 20, a chromium (Cr) film for suppressing a condition in which the Au atoms of the bump 26 are diffused into input/output electrodes 18, or a TiN film for improving the bonding between the input/output electrodes 18 and the raised electrodes 20, may be provided as appropriate.

The surface acoustic wave element 12 is mounted on the mounting substrate 14 made of a BT resin by flip chip mounting after forming the bumps 26. That is, the surface acoustic wave element 12 is mounted on the mounting substrate 14 while positioning the surface acoustic wave element 12 and/or the mounting substrate 14 such that the bumps 26 and the metal plating electrodes 24 on the mounting substrate 14 contact each other in a state in which the surface 12a of the surface acoustic wave element 12, on which the bumps 26 are formed, faces an element mounting surface 14a of the mounting substrate 14. After mounting the surface acoustic wave element 12 on the mounting substrate 14, the surface acoustic wave element 12 is held by vacuum suction using a collet (not shown) and ultrasonic vibrations are applied to the surface acoustic wave element 12 in the surface direction of the mounting substrate 14, to connect the bumps 26 and the gold plated electrodes 24 (see FIG. 4E). Finally, after each surface acoustic wave element 12 is sealed airtightly by enclosing it with dam plates 16A made of the BT resin having a lattice pattern (thickness: 0.4 nm) and a flat cap plate 16B made of the BT resin (thickness: 0.2 nm) on the piezoelectric substrate 28, the manufacturing of each surface acoustic wave device 10 is completed by a dicing process (see FIG. 4F). The mounting substrate 14 and the dam plate (dam part 16A), and the dam plate and the cap plate (cap part 16B) are respectively adhered by a resin adhesive.

As described above, when mounting the surface acoustic wave element 12 on the mounting substrate 14 by flip chip mounting, ultrasonic vibrations are applied to the surface acoustic wave element 12 to connect the bumps 26 on the raised electrode 20 to the gold plated electrodes 24. Such vibrations are applied at an amplitude of approximately 1 μm for about 0.5 seconds. It was revealed by experiments conducted by the inventors that in the conventional surface acoustic wave devices manufactured by forming electrode films of monocrystal aluminum that do not include impurities, cracks occur on the piezoelectric substrate 28 in the area in which gold bumps are formed and the surrounding areas thereof when such vibrations are applied to the surface acoustic wave element 12. It is preferable to have as few cracks as possible since such cracks cause the breakage of wires and deterioration of characteristics of the surface acoustic wave device. On the other hand, as described above, when using an Al alloy as the target material for forming the electrode film, the occurrence of such cracks is reduced.

Figure 5:
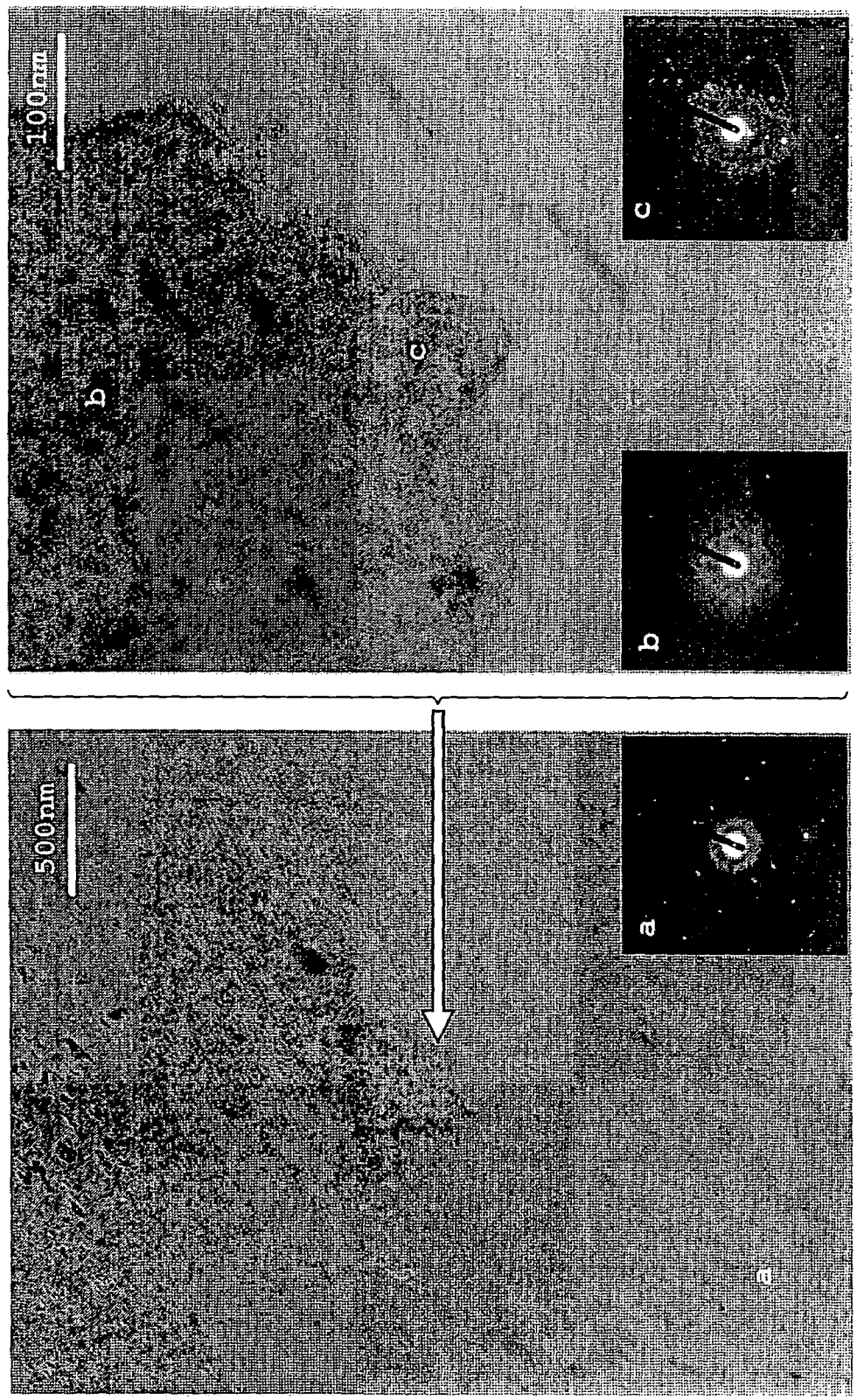
FIG. 5 is a TEM photograph showing the condition of Cu segregation precipitated in the electrode film.
Figure 6:
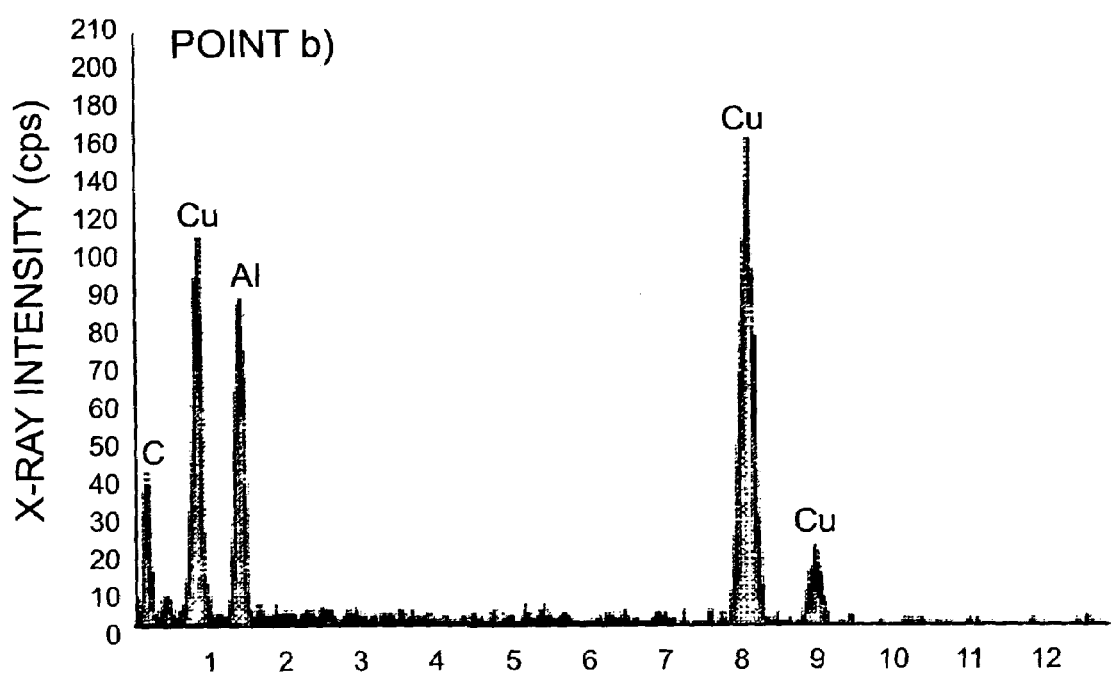
FIG. 6 is graph showing EDS qualitative test results (EDS spectrum) at point B shown in FIG. 5.

After intensive research, the inventors discovered that the production of such cracks results from the segregation of Cu, which is an additive of the target material in the electrode film 34. That is, the occurrence of cracks that are originated by ultrasonic vibration is reduced by the segregation of Cu in the electrode film 34, as recognized in the TEM photographs shown in FIG. 5. FIG. 5 shows TEM photographs showing the conditions of Cu segregation precipitated in the electrode film. It was confirmed that the segregating atoms were the segregation of Cu, by using an EDS (energy dispersion spectroscopy) analysis device for the determination (see FIG. 6). FIG. 6 is a graph showing the results of EDS qualitative analysis (EDS spectrum) at point b shown in FIG. 5. The horizontal axis of the graph is the diffraction angle 2θ (°), and the vertical axis is the X-ray intensity (cps: count-per-second). Therefore, the areas where this segregation is considered to occur for Cu or an Al—Cu alloy are the areas in which the concentration of Cu is high. The grain diameter of the segregated part observed in the photograph a in FIG. 5 is approximately 400 nm, but other grain diameters also fall in the range between at least 100 nm and lesson greater than 1000 nm.

As discussed in detail above, in the surface acoustic wave device 10 and the surface acoustic wave element, local precipitation (segregation) of Cu occurs in the electrode film 34. It was newly discovered by experiments conducted by the inventors that such segregation is effective for reducing the condition in which cracks occur in the piezoelectric substrate 28 during ultrasonic connections for flip chip mounting. That is, because the conditions in which cracks occur in the piezoelectric substrate 28 are reduced, the tolerance against ultrasonic vibration is advantageously improved in this surface acoustic wave device 10.

Next, a surface acoustic wave duplexer equipped with the above described surface acoustic wave element 12 is described with reference to FIG. 7. FIG. 7 is a perspective exploded view showing the surface acoustic wave duplexer according to an exemplary embodiment of this invention. The surface acoustic wave duplexer 40 is an electronic component, in which a signal transmitting filter and a signal receiving filter used respectively for a transmitting part and a receiving part of a cellular phone are packaged as one unit using a branch circuit, such that a single antenna can be shared for transmitting and receiving. Therefore, this surface acoustic wave duplexer 40 is equipped with two surface acoustic wave elements 12 with response frequencies that are different from each other. In addition, the above-described cover 16 (16A and 16B) seals the two surface acoustic wave elements 12 mounted on the mounting substrate 14. On the back side of the surface of the mounting substrate 14 on which the surface acoustic wave elements 12 are mounted, two circuit boards 42, in which square wave form delay circuits are provided, are stacked via insulation plates 44. In such a surface acoustic wave duplexer 40, because the segregation of Cu occurs in the electrode film 34 of the surface acoustic wave elements 12, the condition in which cracks occur in the piezoelectric substrate can be reduced, and the tolerance against the ultrasonic vibrations is advantageously improved.

This invention is not limited to the above-described embodiment, but various modifications are possible. For example, the Al alloy used with the target material for forming the electrode film is not limited to an alloy in which Cu is added to Al, but may be an alloy in which one or more of Cu, Ta, W, and Ti are added to Al. In this case, the occurrence of cracks also is reduced because the segregation of the above-described metal occurs in the electrode film 34 sputtering on the piezoelectric substrate 28.

EXAMPLE 1

A 39°-rotated Y-cut lithium tantalate substrate was prepared as a piezoelectric substrate, and a TiN buffer layer and a monocrystal aluminum electrode film were sequentially laminated on the substrate using a sputtering method. Detailed processes are described below. First, a TiN buffer layer having a thickness of 4 nm was formed on the piezoelectric substrate in a mixed gas of nitrogen and argon, with titanium metal of 99.9% purity as a target material. After forming the TiN buffer layer on the substrate, while maintaining a vacuum inside the sputtering device, an aluminum electrode film having a thickness of approximately 500 nm was formed with aluminum as the target material in which Cu of 0.5 wt % concentration is added. As a result of observing this electrode film by TEM, it became apparent that impurities are segregated in the monocrystal aluminum as shown in FIG. 5. From the results of EDS qualitative analysis evaluation, it was revealed that the grain impurities are composed by highly dense Cu. That is, the Cu included in the target material did not dissolve in the aluminum atoms during the sputtering, but was precipitated as Cu segregation inside the aluminum electrode film.

Such a monocrystal aluminum electrode was formed into electrode patterns using general photolithography techniques. Specifically, a mask pattern of a photoresist was formed on an aluminum electrode film, and electrode patterns were patterned by dry etching the aluminum electrode film in a mixed gas of boron trichloride ($BCl_3$) and chloride ($Cl_2$). Furthermore, to mount the surface acoustic wave element by flip chip mounting, pad electrodes were formed by laminating raised electrodes, which are a laminate of chromium (Cr) and aluminum, at the position of the input/output electrodes of this electrode pattern, and Au bumps were formed on the pattern electrodes using ultrasonic connection techniques.

Moreover, for comparison, after forming the TiN buffer layer, a substrate having an aluminum electrode film formed with aluminum of 99.999% purity that does not include impurities as a target material was separately provided. On this aluminum electrode film, the pad electrodes and Au bumps were formed by a method similar to the above-described method.

Figure 8A:
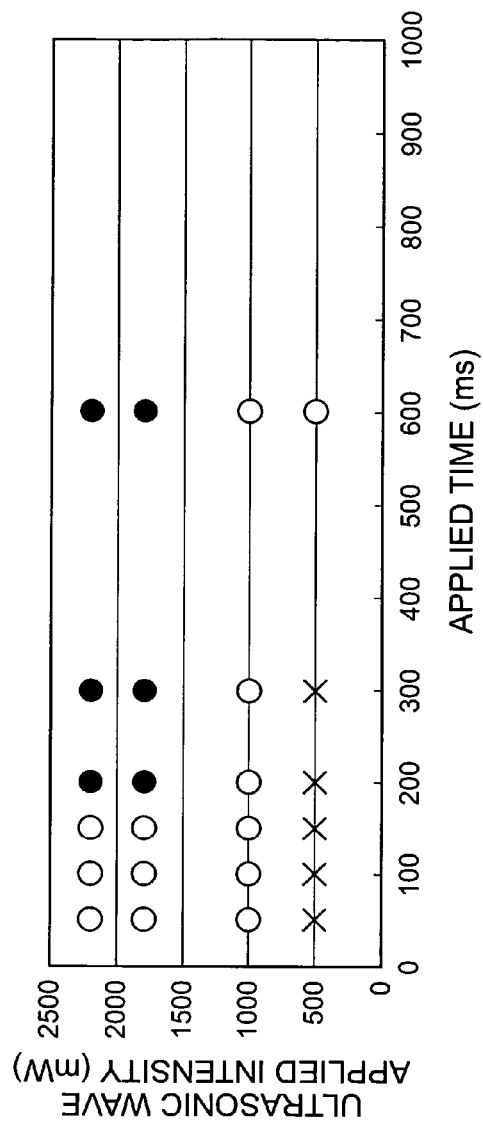
FIGS. 8A and 8B are charts showing breakdown modes after conducting a shear strength test by "○", "●", and "x"
Figure 8B:
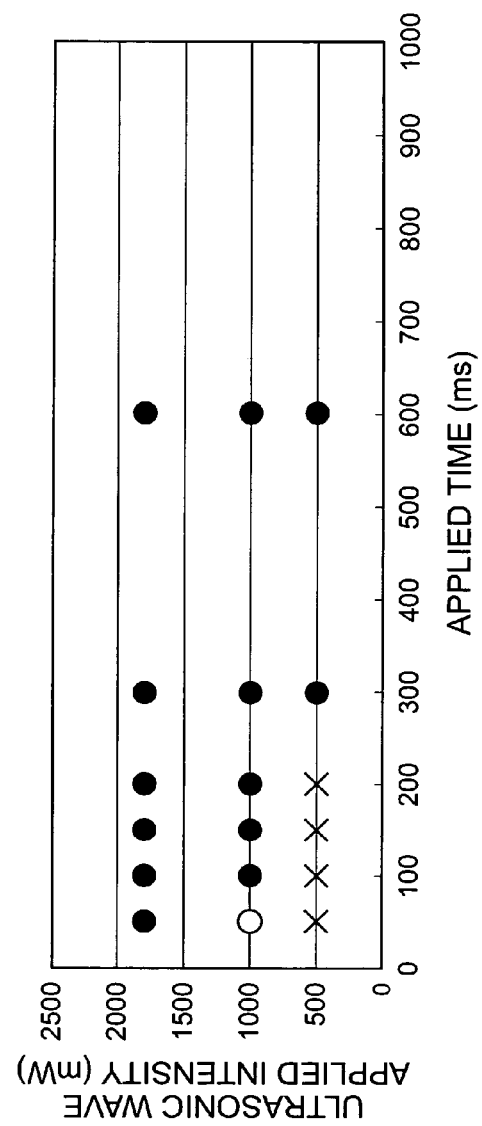

As described above, two kinds of the above described surface acoustic wave elements, in which the materials composing the aluminum electrode films are different, were mounted on respective mounting substrates by flip chip mounting, by changing the ultrasonic intensity and load during the flip chip mounting. Then, die shear strength after mounting on the substrate was measured. The results are shown in FIGS. 8A and 8B. Each figure shows a table in which fracture modes after conducting the shear strength test are indicated by "○", "●", and "x". Here, FIG. 8A is a table showing the results for surface acoustic wave elements in which Cu was added to the target material, and FIG. 8B is a table showing the results for surface acoustic wave elements in which impurities were not added to the target material. In addition, "○" is a mode in which the gold bumps are fractured, "●" is a mode in which cracks occurred in the piezoelectric substrate under the bumps, and "x" is a mode in which the connections between the gold bumps and the gold plated electrodes on the mounting substrates were insufficient.

From FIGS. 8A and 8B, it is understood that the surface acoustic wave elements, in which Cu is added to the target material and Cu is segregated in the aluminum electrodes, has a wider conditional range for the ultrasonic wave intensity and load under which the fracture mode becomes "○", which is ideal for flip chip mounting, and has a narrower conditional range under which the fracture mode becomes "●", which is inappropriate, compared with the surface acoustic wave element in which impurities are not included in the target material and there is no segregation in the aluminum electrode. From this, it is understood that a condition under which cracks occur on the piezoelectric substrate for the surface acoustic wave element is remarkably improved by Cu segregating in the aluminum electrodes.

Figure 9:
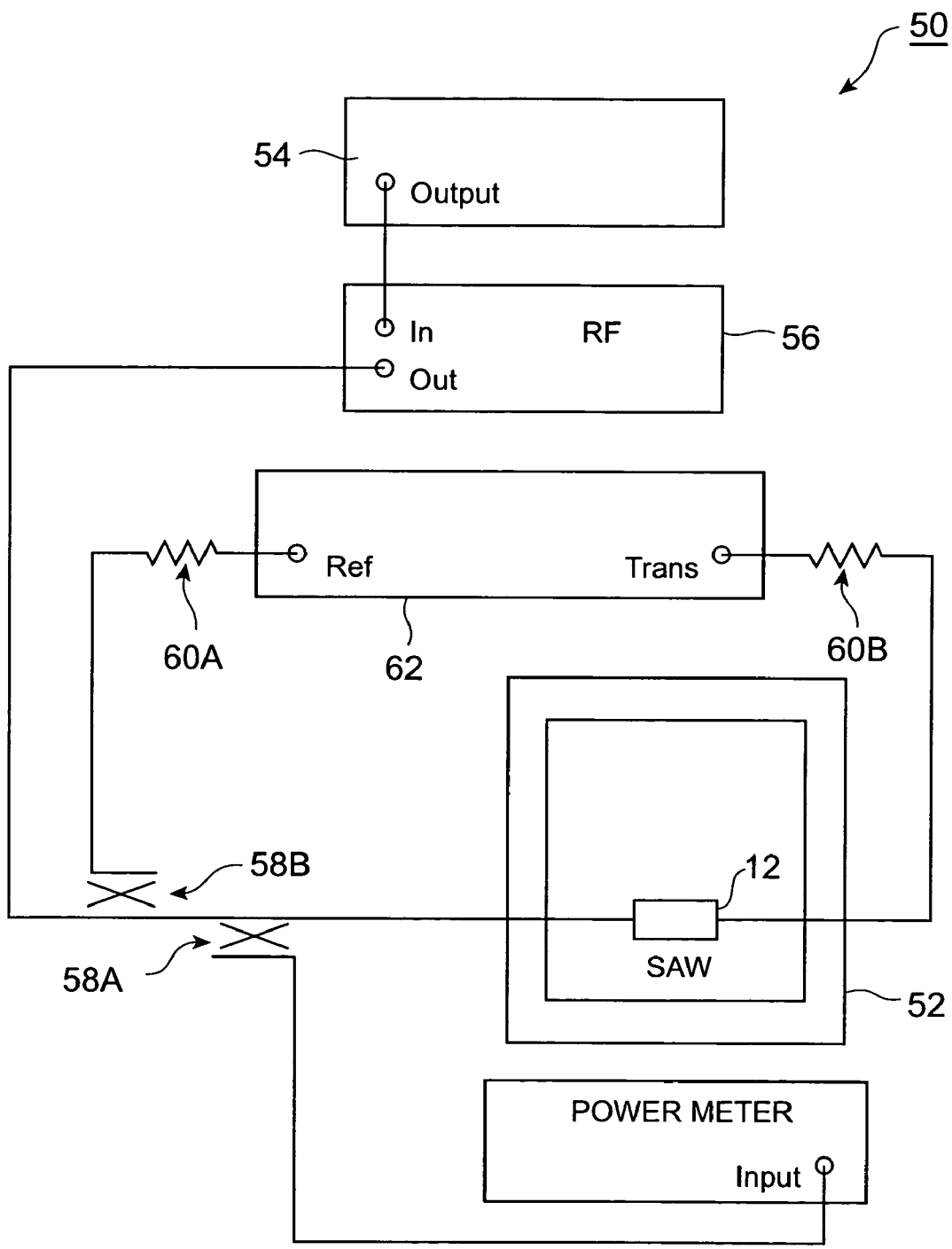
FIG. 9 is a block structural diagram showing a device used for an electric power proofness test of the surface acoustic wave element.

Moreover, electric power proofness for these two kinds of surface wave elements was tested in a gas at 85° C. using a test device 50 shown in FIG. 9. FIG. 9 is a block structural diagram showing a device used for testing the electric power proofness of the surface acoustic wave elements. More particularly, the surface acoustic wave element 12 (SAW filter) was placed in a thermostatic oven 52 of the device 50, and an RF signal in the specified frequency range obtained from a signal generator 54 was amplified to a predetermined strength by an RF power amplifier 56 and applied to an input terminal of the SAW filter 12. Simultaneously, the input power at this time was measured using a directional coupler 58A. In addition, a network analyzer 62 was connected to input/output terminals of the SAW filter 12 via a directional coupler 58B and attenuators 60A and 60B, and the lifetime was evaluated with the power to be applied to the SAW filter 12 being 1.58 W until the insertion loss of the SAW filter 12 deteriorated to 2 dB. As a result, the lifetime of the SAW filter having the aluminum electrodes in which Cu is segregated was 7900 minutes, and the lifetime of the SAW filter having the aluminum thin film electrodes in which there was no segregation was 8000 minutes.

That is, substantially no difference in the electric power proofness was found between the SAW filter having the aluminum electrodes in which Cu is segregated and the SAW filter having the aluminum electrodes in which there is no segregation. This is considered to be because both aluminum electrodes are composed from materials that have no (or extremely small) grain boundaries. This is clearly different from the goal of improving the electric power proofness using additives described in the references discussed in the Background section.

EXAMPLE 2

A 64°-rotated Y-cut lithium niobate substrate was prepared as the piezoelectric substrate, and a Ti metal buffer layer and a monocrystal aluminum electrode film were sequentially laminated on the substrate using a sputtering method. A 99.99% Ti material and a material including Cu at 1 wt % concentration were used as a target material for Ti sputtering at this time and a target material for aluminum, respectively. The film thickness of Ti was 4 nm, and the film thickness of aluminum was approximately 150 nm.

Figure 10:
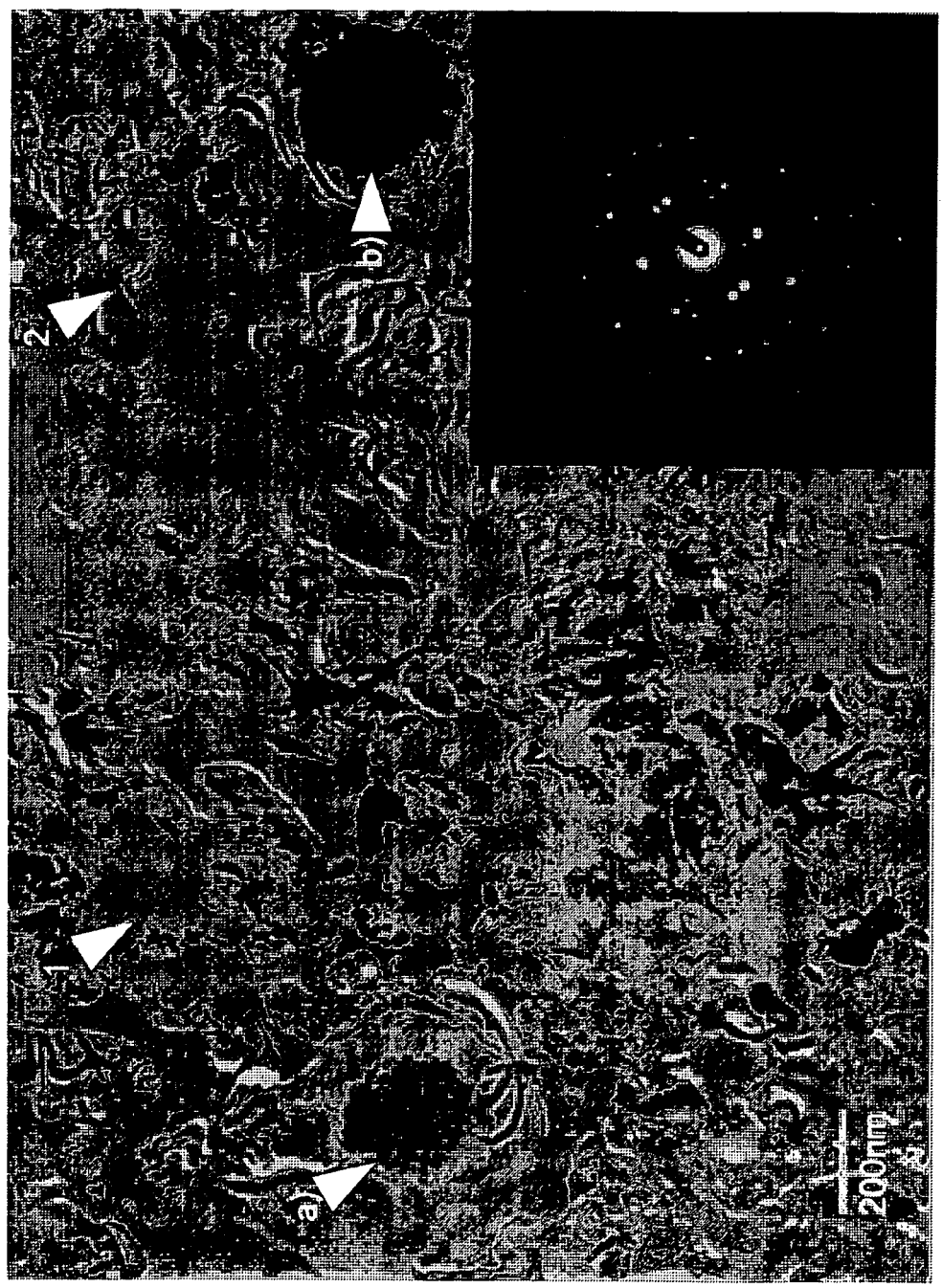
FIG. 10 is a TEM photograph showing the condition of Cu segregation precipitated in the electrode film.
Figure 11:
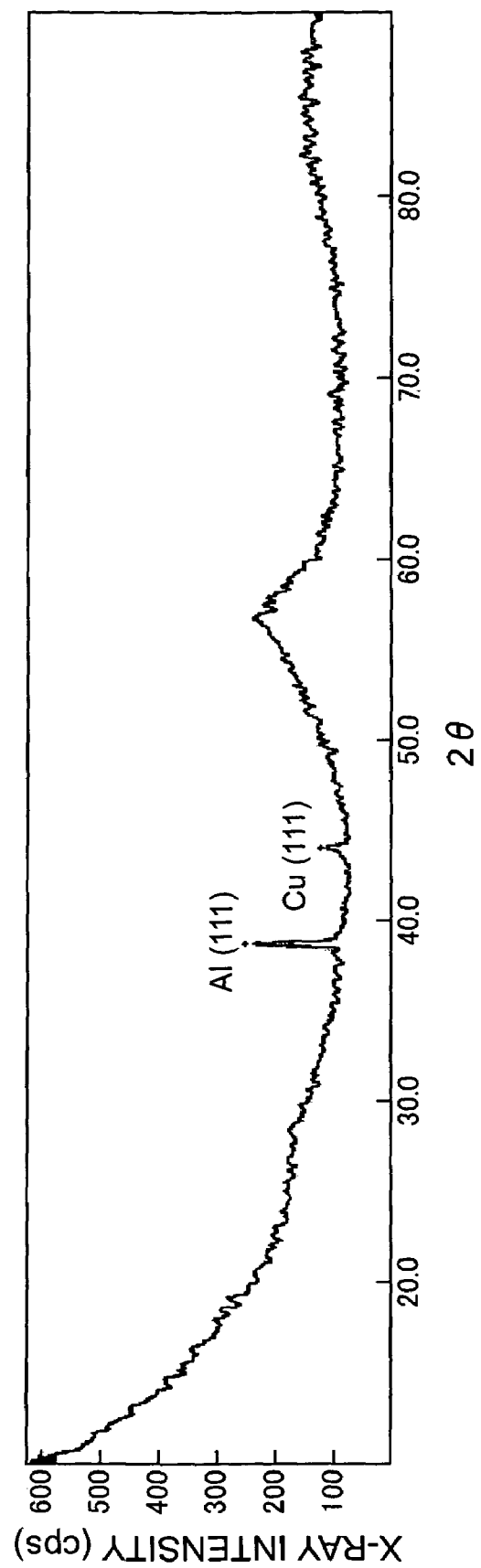
FIG. 11 is a graph showing results of X-ray analysis of the aluminum electrode film.

When analyzing the aluminum film by a transmission electron microscope (TEM), it was determined that grains having different contrast were included in the monocrystal aluminum, and it was understood from the results of EDS qualitative analysis that these grains are Cu grains (see FIG. 10). FIG. 10 shows a TEM photograph indicating the condition of Cu segregation precipitating in the electrode film. In addition, when evaluating the aluminum film by an X-ray analysis, Cu (111) signals were observed in addition to aluminum (111) signals (see FIG. 11). FIG. 11 is a graph showing the results of the X-ray analysis of the aluminum electrode film. In this graph, similar to the graph shown in FIG. 6, the horizontal axis is a diffractive angle $2\theta(°)$, and the vertical axis is the X-ray intensity (cps: count-per-second). This graph shows that crystallite of Cu segregatedly exists in the aluminum electrode film.

Such a monocrystal aluminum film was formed in an electrode pattern using general photolithography techniques. The pattern of this surface acoustic wave device was the above described ladder type. Next, to mount these surface acoustic wave elements by flip chip mounting, pad electrodes were formed by laminating raised electrodes, which were laminates of chromium (Cr) and aluminum, at the position of the input/output electrodes of this electrode pattern. Au bumps were formed on the pad electrodes by ultrasonic connection techniques. For comparison, a sample also was prepared having an aluminum electrode film formed with aluminum of 99.999% purity that does not include impurities as the target material, after forming the Ti buffer layer on a piezoelectric substrate composed of the 64°-rotated Y-cut lithium niobate. The pad electrodes and the Au bumps were formed on the aluminum electrode film by a method similar to the above-described method.

Similar to Example 1, the flip chip connection mountability of these two surface acoustic wave devices was studied by changing the ultrasonic wave intensity and the connection load. As a result, the surface acoustic wave element having the monocrystal aluminum electrodes, in which Cu of 1 wt % concentration is added, has a wide area in which the flip chip connection was stable, and the condition under which cracks occur on the piezoelectric substrate of the surface acoustic wave element was remarkably improved by the segregation of Cu.

Furthermore, electric power proofness of these two kinds of surface acoustic wave devices was evaluated in a gas at 85° C. using the test device 50 shown in FIG. 9. The lifetime was tested with the power to be applied to the SAW filter 12 being at 1.58 W until the insertion loss of the SAW filter 12 deteriorated to 2 dB. As a result, the lifetime of the SAW filter having the aluminum electrodes in which Cu is segregated was 9000 minutes, and the lifetime of the SAW filter having the aluminum thin film electrodes in which there is no segregation was 9100 minutes. That is, there were no substantial differences in the electric power proofness between the SAW filter having the monocrystal aluminum electrodes in which Cu is segregated and the SAW filter having the monocrystal aluminum electrodes in which there is no segregation. This is considered to occur because both of the aluminum electrodes were composed by the material with no (or extremely small) grain boundaries. This is clearly different from the goal of improving the electric power proofness by additives described in the references discussed in the Background section.

As described above, according to an aspect of this invention, surface acoustic wave elements, surface acoustic wave devices, and surface acoustic wave duplexers that have tolerance against ultrasonic vibrations, and methods for manufacturing the surface acoustic wave element, are provided.

What is claimed is:

1. A surface acoustic wave device comprising:
a surface acoustic wave element having a thin film electrode composed of monocrystal aluminum disposed on a piezoelectric substrate, wherein at least one metal of Cu, Ta, W, Ti is segregated in the monocrystal aluminum;
a mounting substrate having an electrode terminal formed on a surface of the mounting substrate on which the surface acoustic wave element is mounted; and
a bump electrode disposed between the thin film electrode of the surface acoustic wave element and the electrode terminal of the mounting substrate.

2. The surface acoustic wave device according to claim 1, further comprising a buffer layer disposed between the thin film electrode and the piezoelectric substrate, the buffer layer is composed of a material having a lattice constant that is between a lattice constant of a material of the piezoelectric substrate and a lattice constant of a material of the thin film electrode.

3. The surface acoustic wave device according to claim 2, wherein the material that forms the buffer layer is TiN or Ti.

4. The surface acoustic wave device according to claim 1, wherein the material of the piezoelectric substrate is lithium tantalate or lithium niobate.

5. The surface acoustic wave device according to claim 1, wherein a grain diameter of the segregated metal is at least 100 nm and no greater than 1000 nm.

6. A surface acoustic wave duplexer comprising the surface acoustic wave device according to claim 1.

7. The surface acoustic wave duplexer according to claim 6, further comprising a buffer layer disposed between the thin film electrode and the piezoelectric substrate, the buffer layer is composed of a material having a lattice constant that is between a lattice constant of a material of the piezoelectric substrate and a lattice constant of a material of the thin film electrode.

8. The surface acoustic wave duplexer according to claim 7, wherein the material that forms the buffer layer is TiN or Ti.

9. The surface acoustic wave duplexer according to claim 6, wherein the material of the piezoelectric substrate is lithium tantalate or lithium niobate.

10. A method of manufacturing a surface acoustic wave duplexer comprising a surface acoustic wave element, the method comprising the steps of:
forming an electrode film composed of monocrystal aluminum, in which at least one metal of Cu, Ta, W and Ti is segregated in the monocrystal aluminum, on a piezoelectric substrate by sputtering Al alloy;
forming a thin film electrode by patterning the electrode film;
forming a bump electrode; and
mounting the thin film electrode and the bump electrode on a mounting substrate having an electrode terminal formed on a surface of the mounting substrate, wherein the bump electrode is disposed between the thin film electrode and the electrode terminal of the mounting substrate.

11. A method of manufacturing a surface acoustic wave device comprising a surface acoustic wave element, the method comprising the steps of:
forming an electrode film composed of monocrystal aluminum, in which at least one metal of Cu, Ta, W and Ti is segregated in the monocrystal aluminum, on a piezoelectric substrate by sputtering Al alloy;
forming a thin film electrode by patterning the electrode film;
forming a bump electrode; and
mounting the thin film electrode and the bump electrode on a mounting substrate having an electrode terminal formed on a surface of the mounting substrate, wherein the bump electrode is disposed between the thin film electrode and the electrode terminal of the mounting substrate.

* * * * *